(12) United States Patent
Worledge

(10) Patent No.: US 7,274,057 B2
(45) Date of Patent: Sep. 25, 2007

(54) TECHNIQUES FOR SPIN-FLOP SWITCHING WITH OFFSET FIELD

(75) Inventor: Daniel C. Worledge, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/831,839

(22) Filed: Apr. 26, 2004

(65) Prior Publication Data

US 2005/0253128 A1 Nov. 17, 2005

(51) Int. Cl.
*H01L 29/76* (2006.01)
(52) U.S. Cl. .................................. 257/295; 257/421
(58) Field of Classification Search ............... 257/295, 257/421
See application file for complete search history.

(56) References Cited

U.S. PATENT DOCUMENTS 6,545,906 B1 4/2003 Savtchenko et al. ........ 365/158
6,633,498 B1 10/2003 Engel et al. ................. 365/158

OTHER PUBLICATIONS

Parkin, S.S.P., "Giant Magnetoresistance and Oscillatory Interlayer Coupling in Polycrystalline Transition Metal Multilayers," Ultrathin Magnetic Structures II, pp. 148-194 (May 12, 1995).

*Primary Examiner*—Long Pham
(74) *Attorney, Agent, or Firm*—Ryan, Mason & Lewis, LLP

(57) ABSTRACT

Techniques for reducing switching fields in semiconductor devices are provided. In one aspect, a semiconductor device comprising at least a first magnetic layer and a second magnetic layer with a spacer layer therebetween is provided. The semiconductor device is configured such that a thickness of at least one of the first magnetic layer and the second magnetic layer maintains a desired activation energy of the semiconductor device in the presence of an applied offsetting magnetic field. A method of reducing a switching field of a semiconductor device having at least a first magnetic layer and a second magnetic layer with a spacer layer therebetween is also provided.

17 Claims, 5 Drawing Sheets

100

TECHNIQUES FOR SPIN-FLOP SWITCHING WITH OFFSET FIELD

FIELD OF THE INVENTION

The present invention relates to semiconductor devices and, more particularly, to reducing switching fields in semiconductor devices.

BACKGROUND OF THE INVENTION

Certain semiconductor devices, e.g., magnetic random access memory (MRAM) devices, use magnetic memory cells to store information. Each magnetic memory cell typically comprises a submicron piece of magnetic material, e.g., having the dimensions of 300 nanometers (nm) by 600 nm in area and five nm thick.

Information is stored in such semiconductor devices as the orientation of the magnetization of a free layer in the magnetic memory cell as compared to the orientation of the magnetization of a fixed (e.g., reference) layer in the memory cell. The magnetization of the free layer may be oriented parallel or anti-parallel to the fixed layer, representing either a logic "1" or a "0." The orientation of the magnetization of a given layer (fixed or free) may be represented by an arrow pointing either to the left or to the right. When the magnetic memory cell is sitting in a zero applied magnetic field, the magnetization of the magnetic memory cell is stable, pointing either left or right. The application of a magnetic field can switch the magnetization of the free layer from left to right, and vice versa, to write information to the magnetic memory cell. One of the important requirements for data storage is that the magnetization of the cell not change orientation when there is a zero applied field, or only a small applied field.

Unfortunately, in practice, the magnetization of one or more magnetic memory cells may change orientation unintentionally, due, at least in part, to thermal activation. Thermal activation occurs when thermal energy from the environment surrounding a given cell overcomes an activation energy barrier so as to change the direction of magnetization of the cell. The occurrences of thermal activation should be minimized. The resulting error rate due to thermally activated switching is called the soft error rate (SER).

One of the objectives in designing MRAM devices is to minimize operating power and area consumed by the devices. Low operating power and small area requires a low switching field for the magnetic memory cell. A low switching field uses a low switching current, which in turn uses less power. Further, lower switching currents require smaller switches, which occupy less area. Consequently, these two design objectives are consistent with one another.

As the area of the magnetic memory cells becomes increasingly smaller, a process generally referred to as "scaling" due to the fact that the cell area is scaled down to increase density, the SER becomes worse. As mentioned above, the activation energy barrier may be overcome due to thermal energy, resulting in thermal activation. Therefore, it is desirable to have a large enough activation energy barrier to prevent thermal activation and to prevent the magnetization of the cell from changing direction unintentionally.

According to single domain theory, the activation energy barrier of the magnetic memory cell is proportional to the volume of the cell. Therefore, as the area is scaled down, assuming nothing else changes, the activation energy barrier decreases and the SER becomes unacceptably large. A conventional, simple solution to this problem would be to increase the thickness of the cell as the area of the cell is scaled down, to thereby maintain a large enough volume to ensure a suitable energy activation barrier level. However, this technique is undesirable, at least in part because a greater magnetic field is required to switch the magnetization of a thicker cell. Thus, a primary goal of the scaling process becomes making the area of the cell smaller, but maintaining the activation energy barrier and the switching field, i.e., preventing the activation energy barrier from becoming too small and preventing the switching field from becoming too large.

U.S. Pat. No. 6,633,498, issued to Engel et al. (hereinafter "Engel"), discloses a method for reducing the write field of a toggle MRAM by adding an easy axis offsetting field. However, while the techniques highlighted in Engel can be employed to reduce the write field, the effects of the offsetting field can result in an increased SER, potentially rendering the cell inoperable.

Therefore, techniques are needed to reduce the magnetic field required to switch a magnetic memory cell while at the same time reducing, or eliminating, the occurrence of soft errors.

SUMMARY OF THE INVENTION

The present invention provides techniques for reducing switching fields in semiconductor devices. In one aspect of the invention, a semiconductor device comprising at least a first magnetic layer and a second magnetic layer with a spacer layer therebetween is provided. The semiconductor device is configured such that a thickness of at least one of the first magnetic layer and the second magnetic layer maintains a desired activation energy of the semiconductor device in the presence of an applied offsetting magnetic field.

In another aspect of the invention, a method of reducing a switching field of a semiconductor device having at least a first magnetic layer and a second magnetic layer with a spacer layer therebetween comprises the following steps. An offsetting magnetic field is applied to reduce the switching field of the device. A thickness of at least one of the first magnetic layer and the second magnetic layer is configured to counteract at least a portion of a reduction in an activation energy of the semiconductor device resulting from the applied offsetting magnetic field.

A more complete understanding of the present invention, as well as further features and advantages of the present invention, will be obtained by reference to the following detailed description and drawings.

DETAILED DESCRIPTION OF PREFERRED EMBODIMENTS

Figure 1:
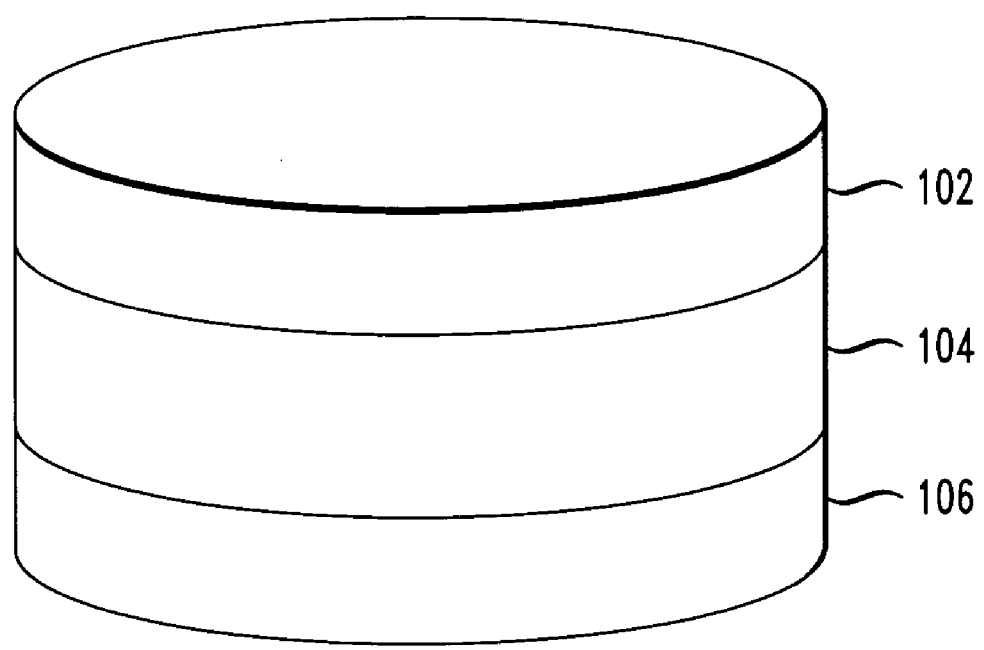
FIG. 1 is a diagram illustrating an exemplary semiconductor device according to an embodiment of the present invention.

FIG. 1 is a diagram illustrating an exemplary semiconductor device 100. Semiconductor device 100, which may comprise a magnetic storage element in a magnetic random access memory (MRAM), comprises a first magnetic layer 102, spacer layer 104 and a second magnetic layer 106. Magnetic layers 102 and 106, as shown in FIG. 1, have a substantially elliptical shape. However, in accordance with the teachings presented herein, each of magnetic layers 102 and 106 may have any suitable non-elliptical shape, such as a substantially circular shape.

Each of magnetic layers 102 and 106 may comprise an element including, but not limited to, nickel, cobalt, iron, manganese and combinations comprising at least one of the foregoing elements. In an exemplary embodiment, first magnetic layer 102 and/or second magnetic layer 106 comprises $Ni_{80}Fe_{20}$. The composition of magnetic layer 102 may be the same as the composition of magnetic layer 106. Alternatively, the composition of magnetic layer 102 may be different from the composition of magnetic layer 106.

The cross-sectional thickness of magnetic layer 102 may be the same as the cross-sectional thickness of magnetic layer 106. Alternatively, the thickness of magnetic layer 102 may be different from the thickness of magnetic layer 106. In an exemplary embodiment, the thickness difference between first magnetic layer 102 and second magnetic layer 106 is less than or equal to about ten percent. For example, the thickness difference between magnetic layer 102 and magnetic layer 106 may be less than or equal to about five percent.

Each of magnetic layers 102 and 106 has an intrinsic anisotropy. In an exemplary embodiment, magnetic layers 102 and 106 have substantially the same intrinsic anisotropy.

Spacer layer 104 may comprise a transition metal. Suitable transition metals include, but are not limited to, chromium, copper, ruthenium, rhodium, palladium, rhenium, osmium, iridium, platinum and combinations comprising at least one of the foregoing transition metals. In an exemplary embodiment, spacer layer 104 comprises ruthenium. In a further exemplary embodiment, spacer layer 104 is non-magnetic.

Spacer layer 104 may comprise an insulating layer. Suitable insulating layers include, but are not limited to, layers comprising aluminum oxide.

In an exemplary embodiment, spacer layer 104 has a thickness of greater than or equal to about 0.5 nanometers (nm). For example, spacer layer 104 may have a thickness of from about one nm to about 1.6 nm. In another exemplary embodiment, spacer layer 104 has a thickness of greater than or equal to about two nm. For example, spacer layer 104 may have a thickness of from about two nm to about 2.8 µm.

According to the teachings presented herein, the write field of semiconductor device 100 can be reduced by offsetting an easy axis of semiconductor device 100. The easy axis of semiconductor device 100 may be defined as the axis along which the direction of magnetization typically lies, as will be described in detail below in conjunction with the description of FIG. 2B. For reference, a hard axis of semiconductor device 100 may be defined as the axis perpendicular to the easy axis. An offsetting magnetic field can be applied to semiconductor device 100 to offset the easy axis.

Figure 2A:
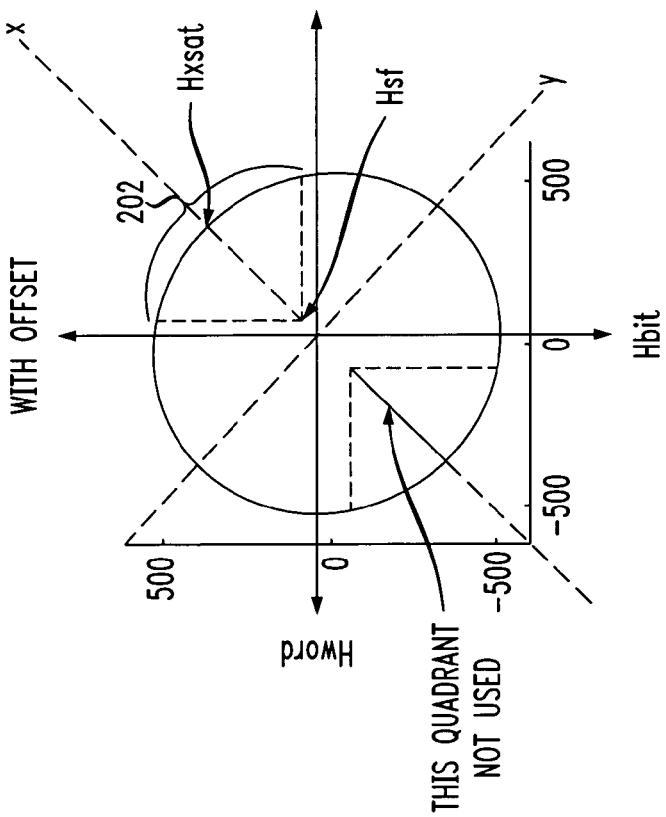
FIG. 2A is a graph illustrating the write field of an exemplary semiconductor device without an offsetting magnetic field.

FIG. 2A is a graph illustrating the write field of an exemplary semiconductor device without an offsetting magnetic field. The magnetic layer thickness t is 3.5 nm, the magnetization $M_s$ is 1,500 electron magnetic units per cubic centimeter (emu/cc), the length a and the width b of the device are 200 nm and 200 nm, respectively, the intrinsic anisotropy $H_i$ is 15 Oersted (Oe) and the exchange coupling J is zero (measured as ergs per square centimeter (ergs/$cm^2$)).

As shown in FIG. 2A, activity in only one quadrant, e.g., quadrant 202 or 204, of the write field, defined by a bit line field (labeled "$H_{bit}$") and a word line field (labeled "$H_{word}$"), is needed to toggle, or switch, the semiconductor device. For example, with reference to quadrant 202, as long as $H_{bit}$ and $H_{word}$ exceed the spin-flop field (labeled "$H_{sf}$"), the field at which the semiconductor device is written, the semiconductor device will toggle. The switching boundary for rectangular field excursions is represented by dashed lines for both $H_{bit}$ and $H_{word}$ in quadrant 202.

In other words, as long as the write field resides in shaded area 206, the semiconductor device will toggle. It is important to note that the saturation field (labeled "$H_{sat}$") approximates the curve at which the orientations of magnetization of the magnetic layers are parallel. Along the x-axis, this saturation point is called $H_{xsat}$. Thus, $H_{sat}$ determines the write margins of the semiconductor device. A write field outside of $H_{sat}$ should be avoided, as it can result in random toggling of the semiconductor device.

Figure 2B:
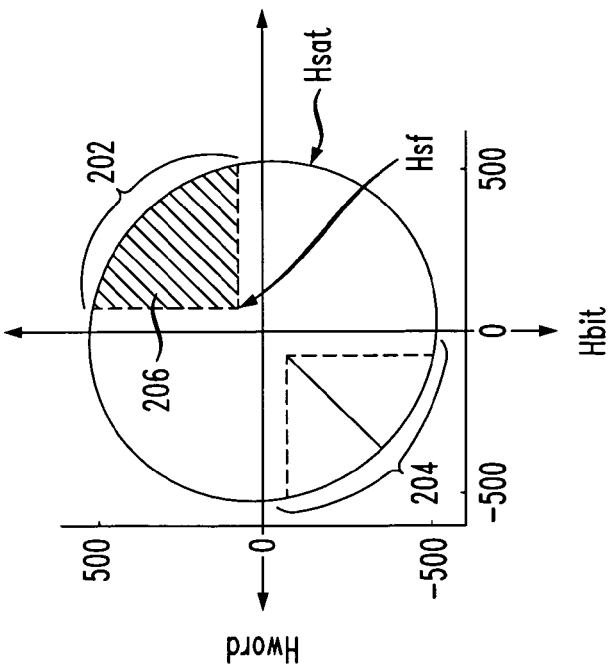
FIG. 2B is a graph illustrating the write field of an exemplary semiconductor device with an offsetting magnetic field according to an embodiment of the present invention.

When an offsetting magnetic field is applied to the semiconductor device, the write field shifts, for example, along an easy axis of the semiconductor device. FIG. 2B is a graph illustrating the write field of an exemplary semiconductor device with an applied offsetting magnetic field. As shown in FIG. 2B, the application of an offsetting magnetic field shifts the write field along the easy axis (labeled "x") such that the spin-flop field $H_{sf}$ is in closer proximity to the bit line and word line fields, $H_{bit}$ and $H_{word}$, respectively, in quadrant 202, as compared to the graph shown in FIG. 2A. As a result, a smaller write field is required to toggle the semiconductor device. For reference, the hard axis of the semiconductor device (labeled "y,") is shown perpendicular to the easy axis.

According to the present teachings, the offsetting magnetic field may be produced, for example, by a dipole field of a simple pinned magnetic layer, by unbalanced antiparallel pinned magnetic layers, or by any other suitable magnetic layers external to the semiconductor device.

Shifting the write field along the easy axis, however, also decreases the activation energy ($E_a$) of the semiconductor device. A decreased $E_a$ can result in an increase in the soft error rate (SER) of the semiconductor device. It is desirable to have an SER of less than or equal to about 0.1 failures over approximately a ten year period. To have an error rate that falls within this parameter, the semiconductor device should have an $E_a$ of greater than or equal to about 60 kT, wherein k is Boltzman's constant and T is the absolute temperature of the semiconductor device.

The $E_a$ of the semiconductor device may be increased (and hence the SER reduced) by increasing the thickness of one or more of the magnetic layers in the semiconductor device, as will be described in detail below. Single domain theory may be used to show the relationship between shifting the write field along the easy axis of the semiconductor device and the resultant decrease in $E_a$. Single domain theory may further be used to show how much offsetting magnetic field should be applied and how much the thickness of the magnetic layer(s) needs to be increased in order to maintain an $E_a$ of, e.g., greater than or equal to about 60 kT.

For simplicity, it may be assumed that the magnetic layers of the semiconductor device have the same thickness t. The results, however, are not substantially affected by small thickness differences. Thickness difference tolerances are described in detail above. The following calculations also assume that the magnetic layers are in the shape of an ellipse and have substantially the same intrinsic anisotropy $H_i$ (e.g., along the direction of the long axis of the ellipse), magnetization $M_s$, width b, length a and are coupled together by an exchange coupling J (e.g., when J is greater than zero the coupling is ferromagnetic, when J is less than zero the coupling is antiferromagnetic). $H_0$ may be defined as the easy axis offsetting magnetic field.

As mentioned above, $H_{sf}$ is the field at which the bit is written and $H_{xsat}$ is the point at which the orientations of magnetization of the magnetic layers are parallel to each other. Thus, $H_{xsat}$ determines the write margins of the device. Therefore, it is beneficial to be able to control the two fields $H_{sf}$ and $H_{xsat}$. The third parameter that is beneficial to be able to control is the $E_a$ (in zero field). Solving the single domain model gives the following values for $H_{sf}$, $H_{xsat}$ and $E_a$:

$$H_{xsat} = 8\pi M_s n_x \frac{t}{b} - \frac{2J}{M_s t} - H_i - H_o \quad (1)$$

$$H_{sf} = \left[ H_i \left( 8\pi M_s n_y \frac{t}{b} - \frac{2J}{M_s t} + H_i \right) \right]^{\frac{1}{2}} - H_o \quad (2)$$

$$E_a = M_s A t \left( H_i - \frac{H_o^2}{H_{xsat}} \right), \quad (3)$$

wherein $n_x$ and $n_y$ are the reduced demagnetizing factors for an ellipse (for a circle, $n_x$ equals $n_y$ which equals 0.79; and for an aspect ratio equal to two, $n_x$ equals 0.32 and $n_y$ equals 0.90). A is the area of the device, e.g., $$\frac{\pi a b}{4}.$$

As shown in Equation 2, above, a positive $H_0$ does indeed reduce $H_{sf}$. However, according to Equation 3, above, a positive $H_0$ also reduces $E_a$. Given the relationship shown in Equations 2 and 3, above, it is important to note that, while the introduction of a positive offsetting field $H_0$ reduces $H_{sf}$ linearly, $H_0$ only reduces $E_a$ quadratically. Therefore, by increasing t while introducing $H_0$, it is possible to reduce $H_{sf}$ while maintaining $E_a$ at a substantially constant value. Further, as b is scaled down, $H_{xsat}$ becomes very large and so there is no problem with $H_{xsat}$ being slightly reduced by $H_0$.

From Equations 1-3, above, it should be noted that four variables can be manipulated for any given semiconductor device. These "free" variables are J, t, $H_i$, and $H_0$. Therefore, in practice, $H_{sf}$ may be reduced using the offsetting magnetic field while maintaining the desired $E_a$, so long as the relationship between these parameters ($H_{sf}$ and $E_a$) and the free variables is taken into account.

Figure 3:
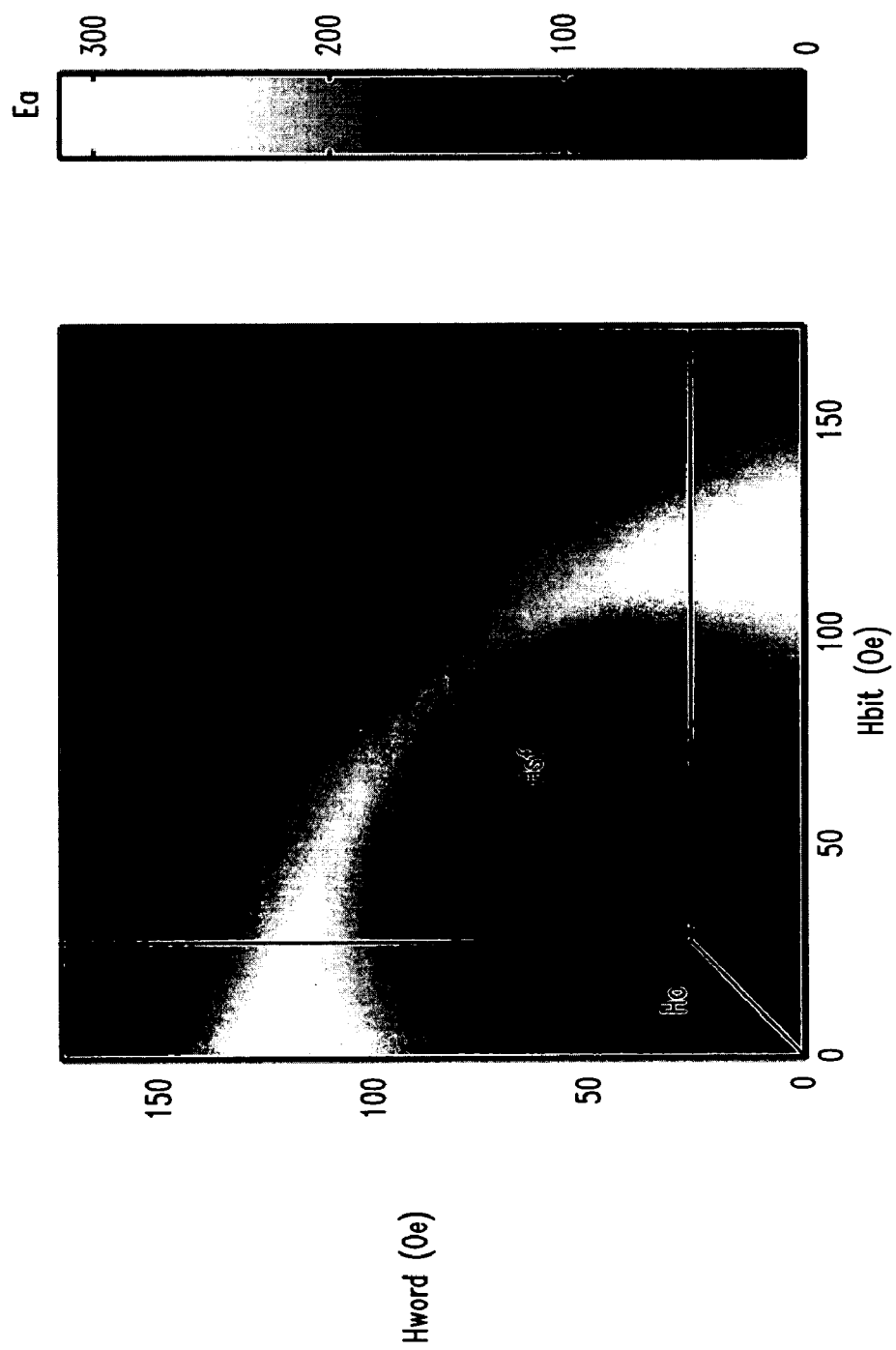
FIG. 3 is a plot illustrating the activation energy ($E_a$) of an exemplary semiconductor device according to an embodiment of the present invention.

FIG. 3 is a plot illustrating the activation energy $E_a$ of an exemplary semiconductor device. Namely, FIG. 3 shows, represented by a shaded scale, $E_a$ values for a particular quadrant, e.g., quadrant 202, of the exemplary semiconductor device of FIGS. 2A and 2B. The plot in FIG. 3 shows that the value of $E_a$ decreases the closer the write field moves to $H_{sf}$, as represented by the concentric rings each signifying $E_a$ values around $H_{sf}$. After applying an offsetting magnetic field, an increase along either $H_{bit}$ or $H_{word}$ in a particular quadrant, will cause $E_a$ to first decrease as the write field approaches $H_{sf}$, and then increase as the write field exceeds $H_{sf}$. For example, in regard to $H_{bit}$ shown in FIG. 3, as the write field increases from zero Oe to about 50 Oe, the $E_a$ will decrease. However, as the write field increases from about 50 Oe to about 100 Oe, the $E_a$ will increase. Thus, at some write field value between zero Oe and about 100 Oe, $E_a$ will have a lowest, e.g., minimum, value.

As mentioned above, it is desirable to have an $E_a$ greater than or equal to about 60 kT. As such, the free variables, as highlighted in conjunction with the discussion of Equations 1-3 above, should preferably be manipulated such that the minimum $E_a$ value encountered during toggling of the device is at least 60 kT.

Figure 4B:
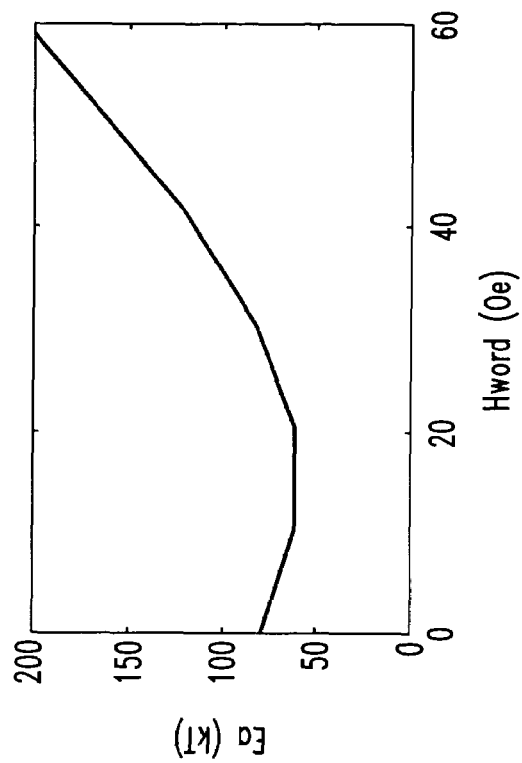
FIG. 4B is a graph illustrating the $E_a$ of an exemplary circular semiconductor device having a diameter of 300 nanometers according to an embodiment of the present invention.
Figure 4A:
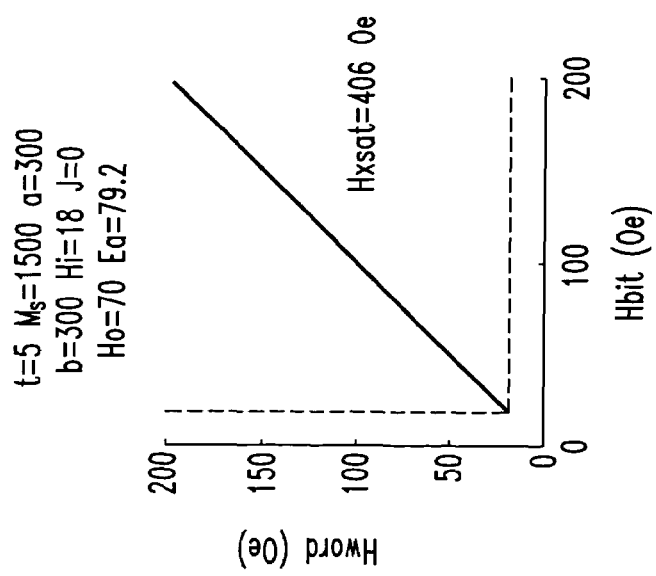
FIG. 4A is a graph illustrating the write field of an exemplary circular semiconductor device having a diameter of 300 nanometers according to an embodiment of the present invention.

FIG. 4A is a graph illustrating the write field of an exemplary circular semiconductor device having a diameter of 300 nm. Namely, the magnetic layer thickness t is five nm, the magnetization $M_s$ is 1,500 emu/cc, the length a and the width b of the device are 300 nm and 300 nm, respectively, the intrinsic anisotropy $H_i$ is 18 Oe, the exchange coupling J is zero, the easy axis offsetting magnetic field $H_0$ is 70 Oe and the activation energy $E_a$ is 79.2 kT. An offsetting magnetic field of 70 Oe results in a low $H_{sf}$ of less than about 25 Oe in each of the $H_{bit}$ and $H_{word}$ directions.

FIG. 4B is a graph illustrating $E_a$ of an exemplary circular semiconductor device having a diameter of 300 nm. The graph in FIG. 4B shows the $E_a$ as the write field is applied along $H_{word}$. Note, as was described above, that $E_a$ first decreases slightly as $H_{word}$ increases, but then increases again, such that $E_a$ is always above about 60 kT. A similar relationship would exist for $H_{bit}$.

Figure 5B:
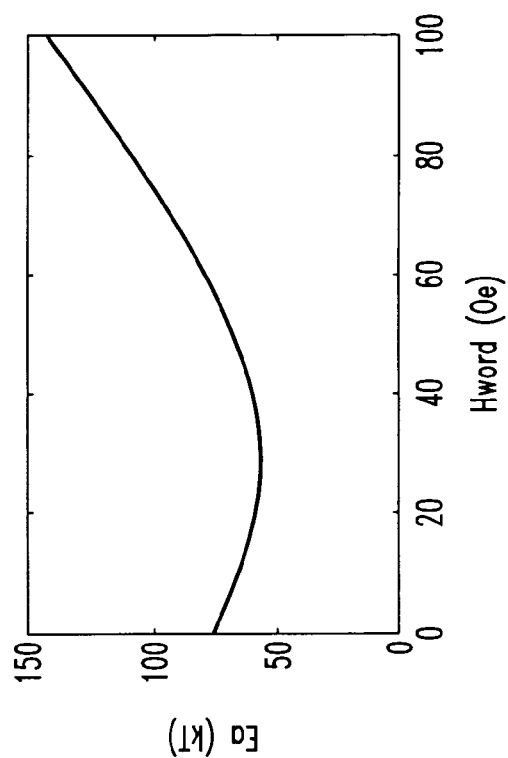
FIG. 5B is a graph illustrating the $E_a$ of an exemplary circular semiconductor device having a diameter of 150 nanometers according to an embodiment of the present invention.
Figure 5A:
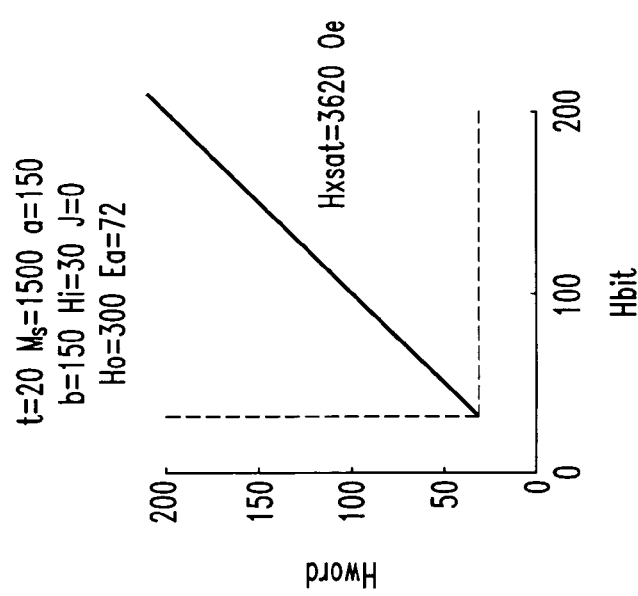
FIG. 5A is a graph illustrating the write field of an exemplary circular semiconductor device having a diameter of 150 nanometers according to an embodiment of the present invention.

FIG. 5A is a graph illustrating the write field of an exemplary circular semiconductor device having a diameter of 150 nm. Namely, the magnetic layer thickness t is 20 nm, the magnetization $M_s$ is 1,500 emu/cc, the length a and the width b of the device are 150 nm and 150 nm, respectively, the intrinsic anisotropy $H_i$ is 30 Oe, the exchange coupling J is zero, the easy axis offsetting magnetic field $H_0$ is 300 Oe and the activation energy $E_a$ is 72 kT. An offsetting magnetic field of 300 Oe results in a low $H_{sf}$ of less than about 40 Oe in each of the $H_{bit}$ and $H_{word}$ directions.

FIG. 5B is a graph illustrating $E_a$ of an exemplary circular semiconductor device having a diameter of 150 nm. The graph in FIG. 5B shows the $E_a$ as the write field is applied along $H_{word}$. Again, as above, $E_a$ first decreases slightly as $H_{word}$ increases, but then increases again, such that $E_a$ is always above about 60 kT. A similar relationship would exist for $H_{bit}$.

Although illustrative embodiments of the present invention have been described herein, it is to be understood that the invention is not limited to those precise embodiments, and that various other changes and modifications may be made by one skilled in the art without departing from the scope or spirit of the invention.

What is claimed is:

1. A semiconductor device comprising at least a first magnetic layer and a second magnetic layer with a spacer layer therebetween, wherein a thickness of at least one of the first magnetic layer and the second magnetic layer has been selected to maintain a desired activation energy of the semiconductor device in the presence of an applied offsetting magnetic field at a level that reduces soft errors, wherein said activation energy equals a product of a device area, magnetization, and thickness multiplied by a difference between an intrinsic anisotropy and a ratio of a square of said applied offsetting magnetic field and an easy axis saturation field.

2. The device of claim 1, wherein the semiconductor device is configured such that the thickness of at least one of the first magnetic layer and the second magnetic layer maintains an activation energy of the semiconductor device of greater than or equal to about 60 kT, wherein k is Boltzmann's constant and T is absolute temperature of the semiconductor device, in the presence of the applied offsetting magnetic field.

3. The device of claim 1, wherein the semiconductor device is configurable for use as a magnetic storage element in a magnetic random access memory (MRAM).

4. The device of claim 1, wherein the applied offsetting magnetic field is produced by at least one magnetic layer external to the semiconductor device.

5. The device of claim 1, wherein the first magnetic layer and the second magnetic layer have a same cross-sectional thickness.

6. The device of claim 1, wherein a difference in cross-sectional thickness of the first magnetic layer relative to the second magnetic layer is less than or equal to about ten percent.

7. The device of claim 1, wherein the first magnetic layer and the second magnetic layer are substantially elliptical.

8. The device of claim 1, wherein the first magnetic layer and the second magnetic layer are substantially circular.

9. The device of claim 1, wherein each of the first magnetic layer and the second magnetic layer have a substantially same intrinsic anisotropy.

10. The device of claim 1, wherein at least one of the first magnetic layer and the second magnetic layer comprises an element selected from the group consisting of nickel, cobalt, iron, manganese and combinations comprising at least one of the foregoing elements.

11. The device of claim 1, wherein at least one of the first magnetic layer and the second magnetic layer comprises $Ni_{80}Fe_{20}$.

12. The device of claim 1, wherein the spacer layer comprises a transition metal.

13. The device of claim 12, wherein the transition metal is selected from the group consisting of chromium, copper, ruthenium, rhodium, palladium, rhenium, osmium, iridium, platinum and combinations comprising at least one of the foregoing transition metals.

14. The device of claim 1, wherein the spacer layer has a thickness of from about one nanometer to about 1.6 nanometers.

15. The device of claim 1, wherein the spacer layer has a thickness of from about two nanometers to about 2.8 nanometers.

16. The device of claim 1, wherein the device is configured so as to substantially maintain said desired activation energy as defined by the following term:

$$M_s A t \left( H_i - \frac{H_o^2}{H_{xsat}} \right),$$

where A is an area of the device, $M_s$ is a magnetization of the device, t is the thickness of at least one of the first and second magnetic layers, $H_i$ is an intrinsic anisotropy of the device, $H_o$ is the applied offsetting magnetic field, and $H_{xsat}$ is a saturation field intersection point with an easy axis of the device.

17. A magnetic random access memory including at least one storage element, the at least one storage element comprising at least a first magnetic layer and a second magnetic layer with a spacer layer therebetween wherein a thickness of at least one of the first magnetic layer and the second magnetic layer has been selected to maintain a desired activation energy of the at least one storage element in the presence of an applied offsetting magnetic field at a level that reduces soft errors, wherein said activation energy equals a product of a device area, magnetization, and thickness multiplied by a difference between an intrinsic anisotropy and a ratio of a square of said applied offsetting magnetic field and an easy axis saturation field.

* * * * *